United States Patent
Becker et al.

(10) Patent No.: US 6,214,161 B1
(45) Date of Patent: Apr. 10, 2001

(54) METHOD AND APPARATUS FOR ANISOTROPIC ETCHING OF SUBSTRATES

(75) Inventors: Volker Becker, Marxzell; Franz Laermer, Stuttgart; Andrea Schilp, Schwaebisch Gmuend, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/129,903

(22) Filed: Aug. 6, 1998

(30) Foreign Application Priority Data

Aug. 7, 1997 (DE) .............................. 197 34 278

(51) Int. Cl.[7] .................................. H01L 21/302
(52) U.S. Cl. .................... 156/345; 438/711; 438/729; 438/731
(58) Field of Search ............... 156/345; 438/707, 438/729, 731, 710, 711; 216/67, 37

(56) References Cited

U.S. PATENT DOCUMENTS

| 5,091,049 | * | 2/1992 | Campbell et al. ............... 216/37 |
| 5,114,529 | * | 5/1992 | Masuyama et al. ............ 438/725 |
| 5,385,624 | * | 1/1995 | Amemiya et al. .............. 156/345 |
| 5,498,312 | * | 3/1996 | Laermer et al. ............... 438/695 |
| 5,540,800 | * | 7/1996 | Qian .............................. 156/345 |
| 5,688,358 | * | 11/1997 | Tanaka et al. ................ 156/345 |
| 5,716,485 | * | 2/1998 | Salimian et al. .............. 156/345 |
| 5,804,033 | * | 9/1998 | Kanai et al. ..................... 216/69 |

FOREIGN PATENT DOCUMENTS

| 42 41 045 | 5/1994 | (DE) . |
| 0 047 395 | 3/1982 | (EP) . |
| 0 065 085 | 11/1982 | (EP) . |

* cited by examiner

Primary Examiner—Benjamin L. Utech
Assistant Examiner—Binh X. Tran
(74) Attorney, Agent, or Firm—Kenyon & Kenyon

(57) ABSTRACT

Method, apparatus and plasma processing system for anisotropic etching of a substrate using a plasma. A high-frequency alternating electromagnetic field is generated using an inductive coupled plasma source, and a reactive gas or reactive gas mixture is exposed to that high-frequency alternating electromagnetic field in order to generate the plasma. The electrically charged particles of the plasma are accelerated onto the substrate. An aperture having at least one effective surface for electron-ion recombination is inserted between the plasma source and the substrate.

17 Claims, 3 Drawing Sheets

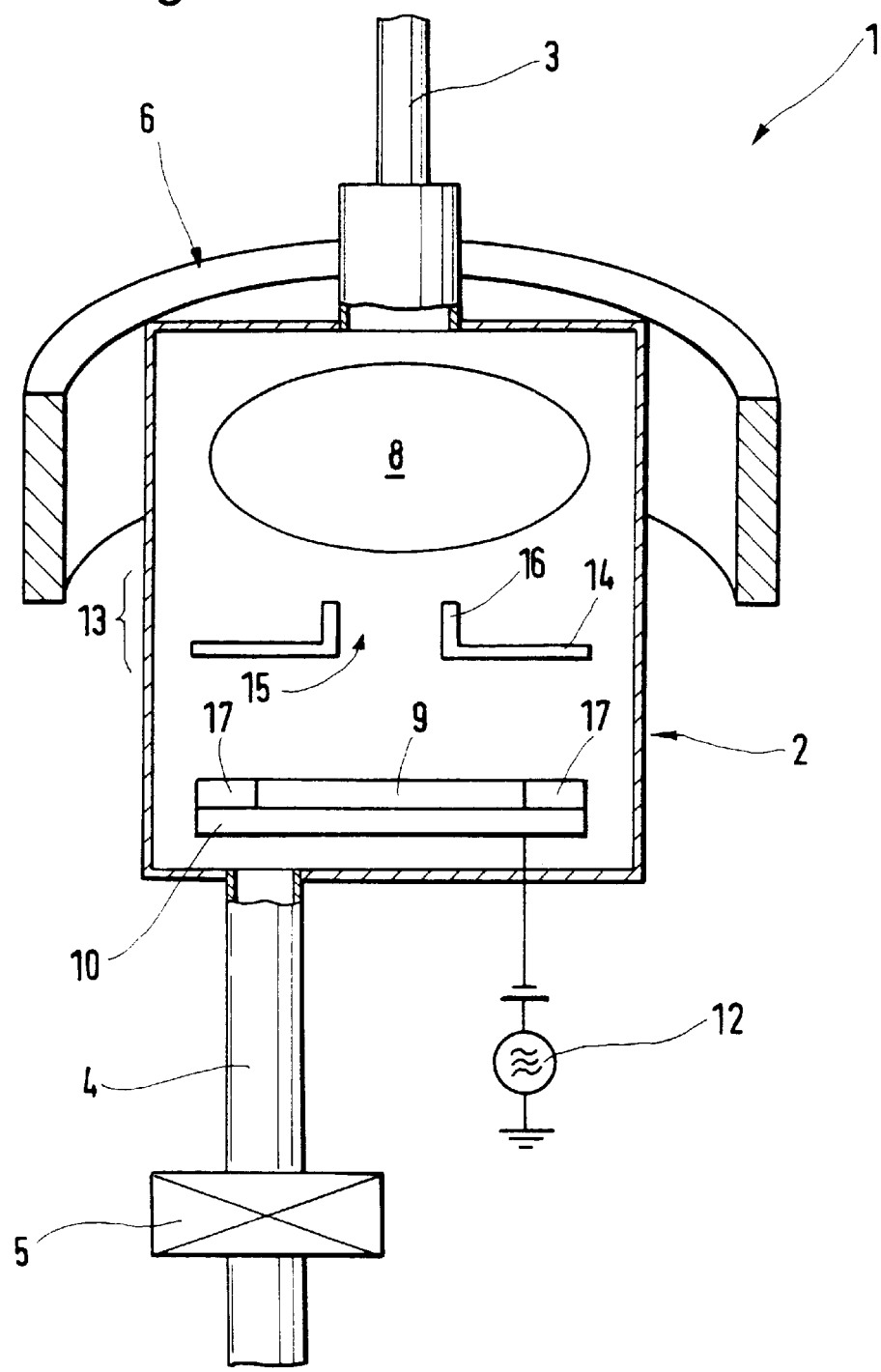

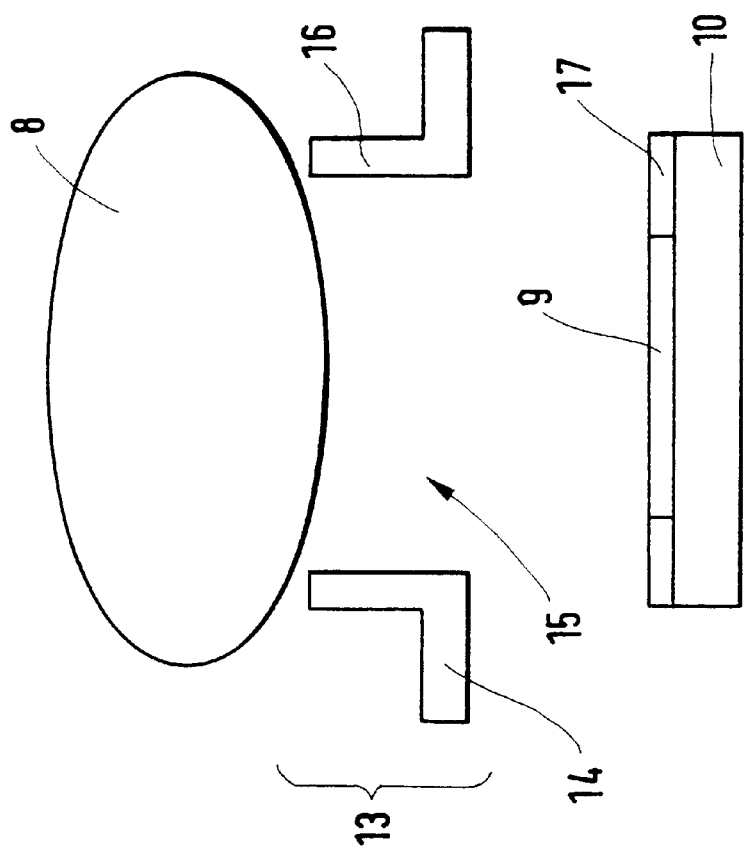
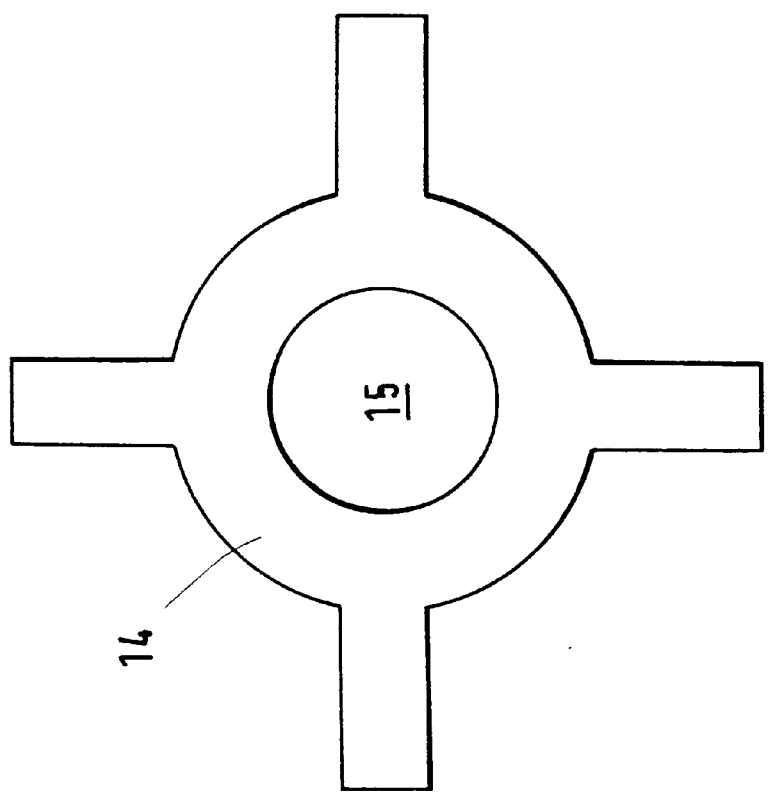

METHOD AND APPARATUS FOR ANISOTROPIC ETCHING OF SUBSTRATES

FIELD OF THE INVENTION

The present invention relates to a method and apparatus for anisotropic etching of substrates using a plasma.

BACKGROUND INFORMATION

Etching of substrates using a plasma is known. It is used principally with substrates made of silicon for semiconductor technology, in particular in the manufacture of chips from silicon wafers, in which patterns defined by etching masks, for example valleys, are etched into the substrate. The etching masks are masking layers, for example photoresist layers, applied onto the surface of the substrates. The plasma is ignited by exciting reactive gases or gas mixtures using high-frequency electromagnetic radiation. This is done, for example, by using an inductively coupled plasma source (ICP source) with high-frequency excitation. A typical ICP source has an excitation coil, placed around the plasma volume and having one or more turns, through which a high-frequency current, for example at a frequency of 13.56 MHZ, flows in order to excite the plasma. One end of the coil (the "hot" end) is thus connected to a high-frequency source.

An etching method of the species for deep silicon etching using an ICP source is described in German Patent Application No. 42 41 045.

The alternating field or magnetic field of the excitation coil is, however, inhomogeneous. This inhomogeneity causes an increase in the quantity of ions and reactive particles at the edge of the plasma as compared with the middle. Because of this excitation geometry, different etching rates are observed in the center and at the edge of the substrate. For example, the etching rate in the middle of a wafer with a diameter of 150 mm can be up to 20% less than in the edge region of the substrate.

In addition, the electrical leakage fields proceeding from the "hot" end of the coil that is at high voltage lead to a correspondingly severe deformation of the inductive plasma. At the same time, the plasma is displaced out of the center of the excitation coil toward the "hot" end. Ablation of the etching mask is accordingly also highly nonuniform, and is displaced from the center of the substrate toward the edge region. Ablation is less in the region of the substrate that is adjacent to the end of the excitation coil in the plasma source that is at high voltage than in the regions of the substrate remote from the "hot" coil end. These inhomogeneities result in inaccuracies in the etched structures.

SUMMARY OF THE INVENTION

The method and apparatus according to the present invention are advantageous is that the inhomogeneities described are compensated for to a considerable extent. By installing and optimizing an aperture according to the present invention, the inhomogeneity of the etching rate can be at least halved. At the same time, the irregular ablation of the etching mask is almost completely suppressed. In fact, a slight overcompensation may even be observed, i.e. ablation of the etching mask decreases slightly toward the substrate edge. The mask profile is now centered. This effect is advantageous because it allows the photoresist to be applied at thinner layer thicknesses. Associated with this are greater patterning accuracy, and a reduction in achievable pattern widths.

The method and apparatus according to the present invention are based on the recognition that the plasma inhomogeneities described above are kept away from the substrate by the method and the apparatus according to the invention. The aperture according to the invention offers an enlargement of the effective surface for electron-ion recombination, while the acceptance angle with respect to the substrate decreases. Expanding the plasma below the aperture toward the substrate results in a dilution of the reactive particles, i.e. of both the ions and the free radicals, which is effective particularly in the edge region of the substrate.

The substrate is thus shielded from the inhomogeneity of the high-frequency coil field of the excitation coil, and from the influence on the plasma of the electrical fields proceeding from the coil end that is at high voltage. Compensation is based on an electron-ion recombination on the walls of the aperture, thus decreasing the ion current density in the edge region of the substrate; and on a dilution effect which is also effective in the edge region of the substrate.

The present invention thus provides an improvement in the uniformity of an ICP source with respect to the substrate.

Another embodiment of the aperture according to the present invention includes an orifice plate having an approximately cylindrical tube that is set on top of it and is introduced into the plasma. The cylindrical tube offers an increase in the effective area for electron-ion recombination, by way of an elongated path length for the electrons and ions in the volume enclosed by this recombination surface.

By coating the substrate electrode around the edge of the substrate with an absorber made of a material which consumes the respective reactive particles, it is additionally possible to simulate a substrate load which extends over the edge region of the substrate and consumes reactive particles. A further cause of nonuniform ablation of the etching mask can thereby be compensated for. Fewer reactive particles are absorbed by the substrate itself in the edge region of the substrate than in the middle. At the same time, the inhomogeneity of the plasma means that production of reactive particles is more intense at the edge. The concentration of reactive particles is thus increased in the edge region of the substrate. The collector shield absorbs this excess. Depending on the dimensions of the collector shield, absolutely homogeneous etching over the substrate surface can be achieved, or the etching rate distribution over the substrate surface can in fact be inverted (etching rate decreases toward the edge).

BRIEF DESCRIPTION OF THE DRAWINGS

FIG. 2 shows a schematic illustration of a plasma processing system, with an exemplary embodiment of an apparatus according to the present invention.

FIG. 3 shows a schematic view of an aperture illustrated in FIG. 2.

FIG. 4 shows a schematic plan view of the orifice plate shown in FIG. 3.

DETAILED DESCRIPTION

Figure 1:
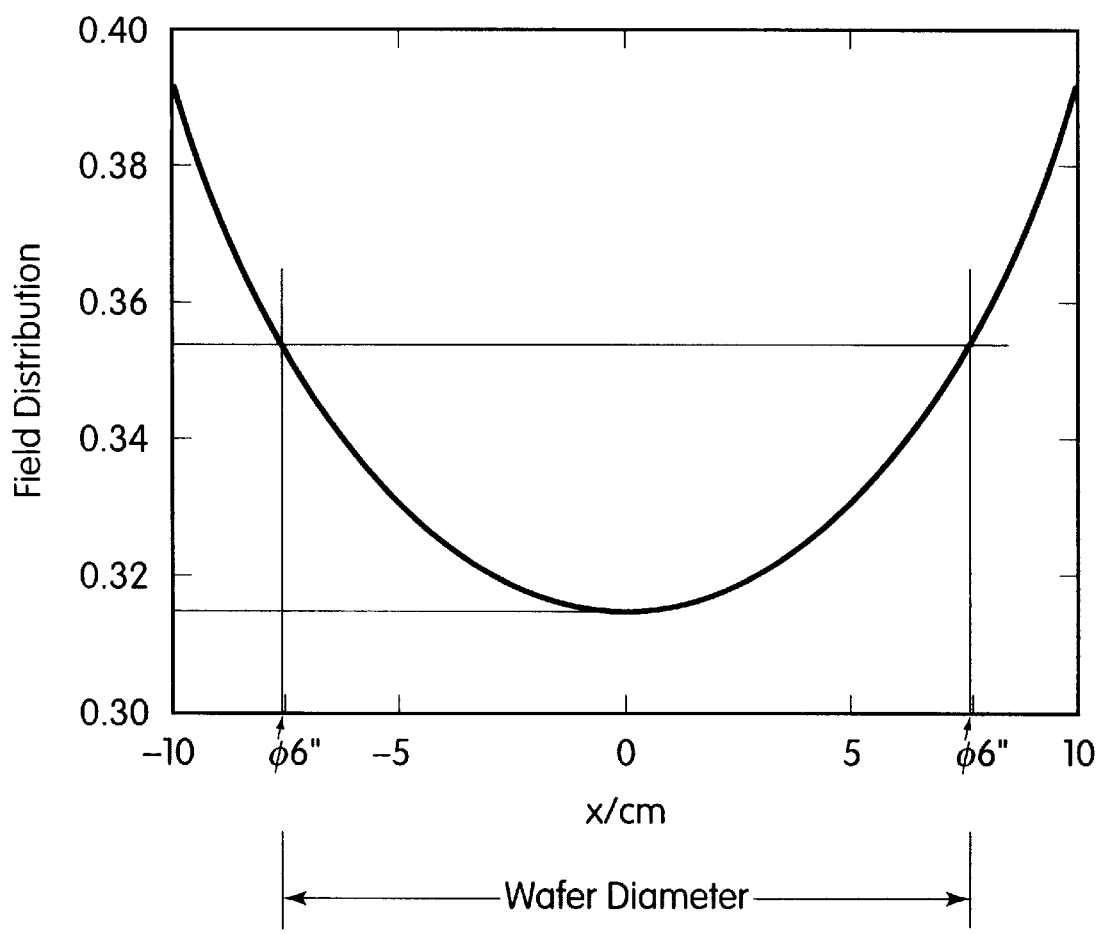
FIG. 1 shows the magnetic field distribution of an inductively coupled plasma source having a single coil turn.

FIG. 1 shows the calculated amplitude profile of the field distribution of the magnetic field of a typical ICP excitation coil. The latter is a coil, through which a high-frequency current flows, having a diameter of 40 cm and a single turn. This coil is contained in a commercial plasma source for generating a high-frequency magnetic field for inductive plasma excitation. This field distribution corresponds substantially to the plasma density distribution of the plasma excited therewith. The "plasma density distribution" is understood to be the distribution of the ion density and of the density of reactive species, for example radicals.

Plotted on this curve is the diameter d of a silicon wafer having a diameter of 150 mm (6-inch wafer), the field minimum being placed at the center point of the wafer. This central symmetry corresponds to the absence of any electrical interference fields. Without interference fields of an electrical nature, the plasma density distribution is also centrally symmetrical.

It is evident that the plasma density calculated in this fashion increases by more than 12% from the middle to the edge of the 6-inch silicon wafer. Since acceleration of the ions toward the substrate by the substrate bias voltage results in a substantially identical ion current density, the etching rate at the edge of the silicon wafer is considerably higher than in the middle.

FIG. 2 schematically shows a plasma processing system 1 in which an apparatus 13 according to the present invention is used. Plasma processing system 1 has a reactor 2 into which can be conveyed, via a delivery fitting 3, a reactive gas or a reactive gas mixture that, in the exemplary embodiment, supplies fluorine. The desired pressure in reactor 2 can be established by way of an extraction fitting 4 with a regulating valve 5.

Also provided is a high-voltage plasma source having an ICP coil 6 for generating a high-density plasma 8. Coupling of the high-frequency magnetic field generated by coil 6 into reactor 2 charged with reactive gas results in ignition of plasma 8. Substrate 9, in this case a 6-inch silicon wafer, is located on substrate electrode 10 which is connected to a further high-frequency voltage source.

In the exemplary embodiment, aperture 13 according to the present invention, depicted schematically in FIGS. 3 and 4, is introduced between the inductive plasma source and substrate 9 in order to homogenize the plasma density distribution and the ion current density. The purpose of aperture 13 is to block out the intensive edge components of the plasma, and at the same time keep electrical leakage fields away from substrate 9. Aperture 13 has an orifice plate 14 which can be fabricated, for example, from aluminum 15 mm thick. FIG. 4 shows the orifice geometry. Aperture 13 is mounted in apparatus 1, for example, on a flanged element (not depicted). The diameter of the opening 15 of orifice plate 14 is greater than the diameter d of wafer 9. In the exemplary embodiment, the orifice size is 170 mm for a diameter of wafer 9 of 150 mm (6-inch wafer).

To complete apparatus 13 according to the present invention, a shield 16 in the form of a vertical cylinder, for example made of aluminum with a wall thickness of 10 mm, was inserted into system 1. Cylinder 16 can be affixed to the edge of orifice plate 14, but can also be mounted separately. Cylinders 13 with a height of 70 mm, 49 mm, and 25 mm can be tested.

In addition, an absorber 17 that is thermally well-coupled to the substrate electrode (for example with vacuum grease), can be installed on substrate electrode 10. The material of absorber 17 is selected so that the respective reactive particles are absorbed and thus consumed. In the present case, silicon or graphite (carbon) can be used to absorb fluorine. Quartz glass or plastics may also be suitable for other reactive particles.

A cylinder height of 25 mm proved to be optimal both in terms of etching rate uniformity and for the ablation of silicon and the etching mask. Higher cylinders resulted in a definite decrease in etching mask ablation toward the wafer edge, so that the ion current density is reduced too much in the edge region of the wafer (overcompensation).

As a control test, cylinder 16 was removed and plain orifice plates 14 of various diameters were tested. The diameters used were 70 mm, 110 mm, 130 mm, 150 mm, and 170 mm.

With the orifice diameters up to 150 mm, which were smaller than the substrate diameter, the etching profile exhibited an intolerable tilt away from the vertical toward the interior of the orifice, i.e. the etched trenches were etched obliquely (at an angle not equal to 90 degrees) into the substrate. This deleterious effect was reduced by enlarging the orifice opening, and disappeared entirely with an orifice opening which exceeded the substrate diameter. With an orifice opening of this kind, however (170 mm in the exemplary embodiment), it was practically impossible to reduce the etching rate at the edge of the wafer any further. Orifice plate 14 was thus ineffective for this diameter.

An additional surface for electron-ion recombination (cylinder 6, in the exemplary embodiment) is therefore necessary, allowing improved plasma uniformity without the effect of the profile tilting in the edge region of substrate 9. Thus an orifice diameter which is greater than the substrate diameter also results in an improvement in the uniformity of the plasma acting on substrate 9, without impairing the profile geometries.

With the orifice apparatus according to the present invention, the etching rate distribution can be improved for all trench widths by a factor of at least 2, depending on the nature and size of the substrate and the plasma source. In experiments using a representative test wafer with and without aperture 13, the etching rate distributions listed in the following tables were obtained.

In all the experiments, 6-inch silicon wafers were etched for 10 minutes. The etching mask, made of photoresist, had a thickness of 1.1 um prior to treatment in all cases. In these experiments, a quartz collector shield was placed around the wafer, so that no absorption of fluorine radicals took place in the edge region of the wafer. What was observed in these experiments was the effect of the aperture according to the present invention. The discrepancy was calculated from the difference between the maximum and minimum etching depth, divided by the average etching depth. This corresponds approximately to twice the quotient of the difference between the maximum and minimum etching depths divided by the sum of the maximum and minimum etching depths:

% discrepancy=[(max. etching depth−min. etching depth)/average etching depth]×100

% discrepancy=2×[(max.−min.)/(max.+min.)]

TABLE 1

| | Etching without aperture | | |
|---|---|---|---|
| Trench width ($\mu$m) | Ablation at wafer center ($\mu$m) | Max. ablation at wafer edge ($\mu$m) | Discrepancy (%) |
| 2.2 | 15.1 | 17.3 | 14 |
| 5.0 | 17.5 | 20.2 | 15 |
| 60 | 23.2 | 27.0 | 16 |

TABLE 2

Etching with aperture, orifice diam. 170 mm, cylinder height 25 mm

| Trench width (μm) | Ablation at wafer center (μm) | Max. ablation at wafer edge (μm) | Discrepancy (%) |
|---|---|---|---|
| 2.2 | 17.4 | 18.7 | 7.4 |
| 5.0 | 19.6 | 21.3 | 8.7 |
| 60 | 25.4 | 27.0 | 6.3 |

TABLE 3

Difference between edge and center etching rates, as a function of width of absorber 17

| Trench width (μm) | Difference with 5 cm width (%) | Difference with 2.5 cm width (%) | Difference with 1 cm width (%) |
|---|---|---|---|
| 2.2 | −16.8 | −11.5 | −3.6 |
| 5.0 | −15.7 | −10.8 | −4.4 |
| 60 | −20.8 | −13.8 | −6.7 |

The tables show a definite improvement in the uniformity of the etching rate by a factor of approximately 2, consistently for all the trench widths investigated. With the process parameters that were selected, the profiles in the 60-um wide trenches are exactly vertical; in the narrow trenches, they tend to be slightly positive, i.e. there is a minimal narrowing of the trenches with increasing depth. No further profile tilt away from the vertical is apparent. The desired profile shape can of course be influenced in one direction or the other by varying the parameters.

At the same time, it is observed that ablation of the etching mask photoresist is much more uniform. Without aperture 13, there is a difference of a factor of 2 between the minimum ablation rate in the center of the "eye" (which is displaced about 4 cm out from the center of the wafer) and the maximum ablation rate at the opposite edge of the wafer (70% in terms of the average resist ablation), while the discrepancy in ablation rate with aperture 13 is a maximum of 17.5% (and in fact much less on average), and the resist profile is exactly centered on the middle of the wafer. The residual resist thickness rises, while resist ablation tends to decrease toward the wafer edge.

Since the resist ablation mechanism is simply ion-induced etching, the residual resist profile is a direct indication of the distribution of the ion current density over the substrate surface. The slight increase in residual resist thickness toward the edge region of the substrate thus means complete compensation, or in fact slight overcompensation, for the source-related inhomogeneity of the ion density distribution.

The centering and the improved uniformity mean that the selectivity of the process with respect to the etching mask can be better utilized over the entire substrate surface. In addition, the accuracy of the trenched patterns over the substrate surface is dramatically improved. Since the pattern loss resulting from the resist loss is of approximately equal magnitude everywhere, this effect enhances chip yield.

The method and the apparatus according to the present invention are therefore capable of shielding the substrate practically completely from electrostatically coupled leakage fields proceeding from the region of the coil end that is at high voltage, and additionally capable of homogenizing the ion current density.

In a second series of experiments, in addition to the use of an aperture the effect of absorber 17 was investigated. In the exemplary embodiment, absorber 17 was made of silicon, although graphite, for example, is also suitable for the absorption of reactive fluorine particles. The process parameters were the same as described above. First of all, the falloff in etching rate at the wafer edge was investigated as a function of the width of absorber 17.

This effect of a decrease in etching rate toward the wafer edge is attributable to the fact that without an effective absorber 17, more reactive particles (fluorine radicals, in the exemplary embodiment) are consumed in the center of the wafer than in the edge region of the wafer. With an effective absorber 17 made of silicon or graphite, the concentration of fluorine radicals in the edge region is decreased, since absorber 17 absorbs a certain proportion and consumes them in etching reactions. The etching rate on wafer 9 thus decreases.

Of course other materials which collect reactive particles, such as polymers, are also conceivable.

What is claimed is:

1. An apparatus for homogenizing a plasma, comprising:
   an inductively coupled plasma source generating the plasma; and
   an element associated with the inductively coupled plasma source, the element including an orifice plate having an aperture and at least one effective surface for an electron-ion recombination, the at least one effective surface having a dimension extending beyond a plane of the aperture.

2. The apparatus according to claim 1, wherein the element includes an approximately cylindrical attachment.

3. The apparatus according to claim 2, wherein at least one of the orifice plate and the cylindrical attachment is composed of a metal material.

4. The apparatus according to claim 3, wherein the metal material is a fluorine-resistant material.

5. The apparatus according to claim 3, wherein the metal material includes an aluminum material.

6. A plasma processing system for anisotropicly etching a substrate using a plasma, comprising:
   a plasma source generating a high-frequency alternating electromagnetic field;
   a reactor generating the plasma from reactive particles using the high-frequency alternating electromagnetic field on one of a reactive gas and a reactive gas mixture;
   a substrate electrode accelerating an ion current contained in the plasma onto the substrate; and
   an element situated between the plasma source and the substrate electrode, the element including an orifice plate having an aperture and at least one effective surface for an electron-ion recombination, the at least one effective surface having a dimension extending beyond a plane of the aperture.

7. The plasma processing system according to claim 6, wherein a diameter of the aperture is greater than a diameter of the substrate.

8. The plasma processing system according to claim 6, further comprising an absorber situated around the substrate for absorbing reactive particles of the plasma.

9. The plasma processing system according to claim 8, wherein the absorber is composed of at least one of a silicon material, a quartz material, a plastic material and a graphite material.

10. A apparatus for anisotropic etching a substrate using a plasma, comprising:

an inductively coupled plasma source generating a high-frequency alternating electromagnetic field, the inductively coupled plasma source generating the plasma by exposing one of a reactive gas and a reactive gas mixture to the high-frequency alternating electromagnetic field, wherein electrically charged particles of the plasma are accelerated onto the substrate; and an orifice plate having an aperture and arranged between the plasma source and the substrate, the orifice plate having at least one effective surface for an electron-ion recombination which is associated with the aperture, wherein the at least one effective surface is configured as an approximately cylindrical attachment on the orifice plate, and wherein a diameter of the aperture is greater than a diameter of the substrate.

11. An apparatus for anisotropicly etching a substrate, the apparatus comprising:

an arrangement for generating a high-frequency alternating electromagnetic field;

an arrangement for generating a plasma by exposing one of a reactive gas and a reactive gas mixture to the high-frequency alternating electromagnetic field;

an arrangement for accelerating electrically charged particles of the plasma onto the substrate; and an orifice plate having an aperture being provided between an inductively coupled plasma source and the substrate, the orifice plate being associated with at least one effective surface for an electron-ion recombination, the at least one effective surface having a dimension extending beyond a plane of the aperture.

12. The apparatus according to claim 11, wherein the at least one effective surface includes a cylindrically-shaped surface.

13. The apparatus according to claim 11, herein the at least one effective surface is a cylinder.

14. The apparatus according to claim 11, wherein the at least one effective surface is a cylinder having a vertical dimension of about 25 mm.

15. The apparatus according to claim 11, wherein a diameter of the aperture is no less than a diameter of the substrate.

16. The apparatus according to claim 11, wherein at least one of the orifice plate and the at least one effective surface includes at least one of a metal material, a fluorine-resistant metal and an aluminum material.

17. The apparatus according to claim 11, further comprising an absorber including at least one of a quartz material, a silicon material, a plastic material and a graphite material.

* * * * *